(12) United States Patent
Chen

(10) Patent No.: US 7,473,935 B2
(45) Date of Patent: Jan. 6, 2009

(54) WHITE-LIGHT EMITTING SEMICONDUCTOR DEVICE

(75) Inventor: Cheng-Chuan Chen, Tainan Hsien (TW)

(73) Assignee: Genesis Photonics Inc., Tainan Hsien (TW)

( * ) Notice: Subject to any disclaimer, the term of this patent is extended or adjusted under 35 U.S.C. 154(b) by 300 days.

(21) Appl. No.: 11/213,740

(22) Filed: Aug. 30, 2005

(65) Prior Publication Data
US 2006/0231845 A1   Oct. 19, 2006

(30) Foreign Application Priority Data
Apr. 14, 2005  (TW) ............... 94111824 A

(51) Int. Cl.
*H01L 29/201* (2006.01)
*H01L 33/00* (2006.01)
(52) U.S. Cl. .............. 257/90; 257/79; 257/88; 257/89; 257/94; 257/96; 257/99; 257/100; 257/E33.032
(58) Field of Classification Search ............. None
See application file for complete search history.

(56) References Cited
U.S. PATENT DOCUMENTS

| | | | |
|---|---|---|---|
| 2003/0209704 A1* | 11/2003 | Yamada | 257/14 |
| 2004/0217364 A1* | 11/2004 | Tarsa et al. | 257/89 |
| 2005/0092980 A1* | 5/2005 | Chen et al. | 257/14 |
| 2005/0194608 A1* | 9/2005 | Chen | 257/100 |
| 2005/0230693 A1* | 10/2005 | Chen | 257/89 |
| 2006/0081832 A1* | 4/2006 | Chen | 257/13 |
| 2006/0131595 A1* | 6/2006 | Chen | 257/89 |
| 2006/0146563 A1* | 7/2006 | Chen | 362/561 |

* cited by examiner

Primary Examiner—Andy Huynh
Assistant Examiner—Hoang-Quan T Ho
(74) Attorney, Agent, or Firm—Stephen A. Bent; Foley & Lardner LLP

(57) ABSTRACT

A white-light emitting semiconductor device includes a first light-emitting die, a second light-emitting die, a photostimulable luminescent substance, and a holding assembly. The first light-emitting die emits a first radiation having a first wavelength range. The second light-emitting die emits a second radiation having a second wavelength range, and a third radiation having a third wavelength range different from the second wavelength range. The photostimulable luminescent substance is excitable to emit a fourth radiation having a fourth wavelength range. The fourth radiation is mixed with the first, second, and third radiations to result in white light. The holding assembly holds the first and second light-emitting dies, and the photostimulable luminescent substance.

9 Claims, 9 Drawing Sheets

US 7,473,935 B2

WHITE-LIGHT EMITTING SEMICONDUCTOR DEVICE

CROSS-REFERENCE TO RELATED APPLICATION

This application claims priority of Taiwanese Application No. 094111824, filed on Apr. 14, 2005.

BACKGROUND OF THE INVENTION

1. Field of the Invention

The invention relates to a white-light emitting semiconductor device, more particularly to a white-light emitting semiconductor device which has a superior color rendering index (CRI), and which is applicable to a car light, a camera flash, a luminescent device, and the like.

2. Description of the Related Art

A conventional fluorescent lamp contains rare earth phosphorescent coating. Therefore, the white light emitted by the conventional fluorescent lamp is primarily a light blend obtained via a spectrum combination of three primary color lights, i.e., blue light (wavelength: about 452 nm), green light (wavelength: about 543 nm), and red light (wavelength: about 611 nm). However, the light blend emitted by the conventional fluorescent lamp contains little of light, such as cyan light or yellow light, which has a spectrum between those of the primary color lights. Therefore, the conventional fluorescent lamp cannot provide a superior CRI.

Additionally, a mobile phone or a personal digital assistant having a digital camera function usually contains a white-light emitting device as a light source of the digital camera. The white-light emitting device usually contains a light emitting diode emitting blue light and a phosphorescent material excitable by the blue light to emit yellow light. The yellow light is combined with the blue light emitted by the light emitting diode to produce white light. For example, U.S. Pat. No. 5,998,925 discloses such a white-light emitting device. However, in the aforementioned white-light emitting device, since the intensity of the red light portion is insufficient, the CRI of the conventional white-light emitting device is inferior, which leads to an inferior image-capturing effect.

SUMMARY OF THE INVENTION

Therefore, it is an object of the present invention to provide a white-light emitting semiconductor device which has a superior CRI, which is energy-efficient, and which has a relatively small size.

The white-light emitting semiconductor device according to this invention includes a first light-emitting die, a second light-emitting die, a photostimulable luminescent substance, and a holding assembly. The first light-emitting die emits a first radiation having a first wavelength range. The second light-emitting die emits a second radiation having a second wavelength range, and a third radiation having a third wavelength range different from the second wavelength range. The photostimulable luminescent substance is excitable to emit a fourth radiation having a fourth wavelength range. The fourth radiation is mixed with the first, second, and third radiations to result in white light. The holding assembly holds the first and second light-emitting dies, and the photostimulable luminescent substance.

BRIEF DESCRIPTION OF THE DRAWINGS

Other features and advantages of the present invention will become apparent in the following detailed description of the preferred embodiments with reference to the accompanying drawings, of which.

DETAILED DESCRIPTION OF THE PREFERRED EMBODIMENTS

Figure 1:
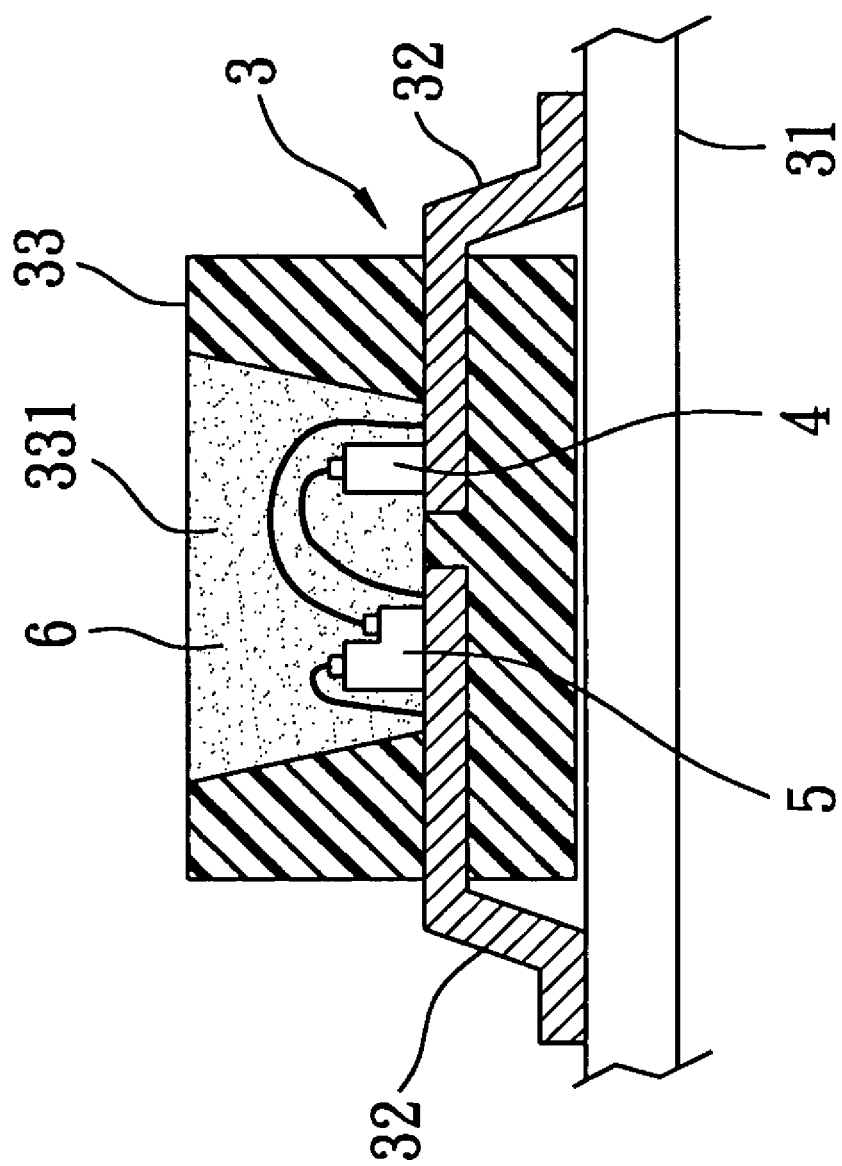
FIG. 1 is a schematic sectional view of the first preferred embodiment of a white-light emitting semiconductor device according to this invention.

Before the present invention is described in greater detail, it should be noted that like elements are denoted by the same reference numerals throughout the disclosure.

Referring to FIG. 1, the first preferred embodiment of a white-light emitting semiconductor device according to this invention is shown to include a first light-emitting die 4, a second light-emitting die 5, a photostimulable luminescent substance 6, and a holding assembly 3.

The holding assembly 3 holds the first and second light-emitting dies 4,5, and the photostimulable luminescent substance 6, and includes a conductive supporting body 31, a holding member 33 mounted on the conductive supporting body 31 and formed with a receiving recess 331 for receiving the first and second light-emitting dies 4,5, and a pair of leads 32 penetrating through the holding member 33 and electrically connected to the conductive supporting body 31. Each of the leads 32 is electrically connected to the first and second light-emitting dies 4,5. The photostimulable luminescent substance 6 is filled in the receiving recess 331 to encapsulate the first and second light-emitting dies 4,5.

The holding assembly 3 is electrically connected to an external electric source (not shown), which provides electric power to actuate the first light-emitting die 4 to emit a first radiation having a first wavelength range, and to actuate the second light-emitting die 5 to emit a second radiation having a second wavelength range and a third radiation having a third wavelength range different from the second wavelength range. In this embodiment, the photostimulable luminescent substance 6 is excitable by the third radiation to emit a fourth radiation having a fourth wavelength range. The fourth radiation is mixed with the first, second, and third radiations to result in white light.

In the preferred embodiment, the conductive supporting body 31 is a printed circuit board. However, other structures, such as an electrically conductive wiring or a substrate made by semiconductor technology, can be used as the conductive supporting body 31.

In the preferred embodiment, the first radiation is red light, the second radiation is green light, and the third radiation is blue light. The first wavelength range is from 575 nm to 700 nm, the second wavelength range is from 495 nm to 560 nm, and the third wavelength range is from 400 nm to 495 nm. The fourth radiation emitted by the photostimulable luminescent substance 6 is yellow light, and the fourth wavelength range is from 540 nm to 600 nm.

The photostimulable luminescent substance 6 suitable for use in this invention includes a material having a formula $R_3(Al_{(1-x)}, Ga_x)_5O_{12}$:Ce, where R is selected from the group consisting of Y, Tb, Gd, Lu, La, Sm, and $0 \leq x \leq 1$. Preferably, R is Y or Tb, and the preferred material for the photostimulable luminescent substance 6 is yttrium aluminum garnet (YAG:Ce) or terbium aluminum garnet (TbAG:Ce).

Figure 2:
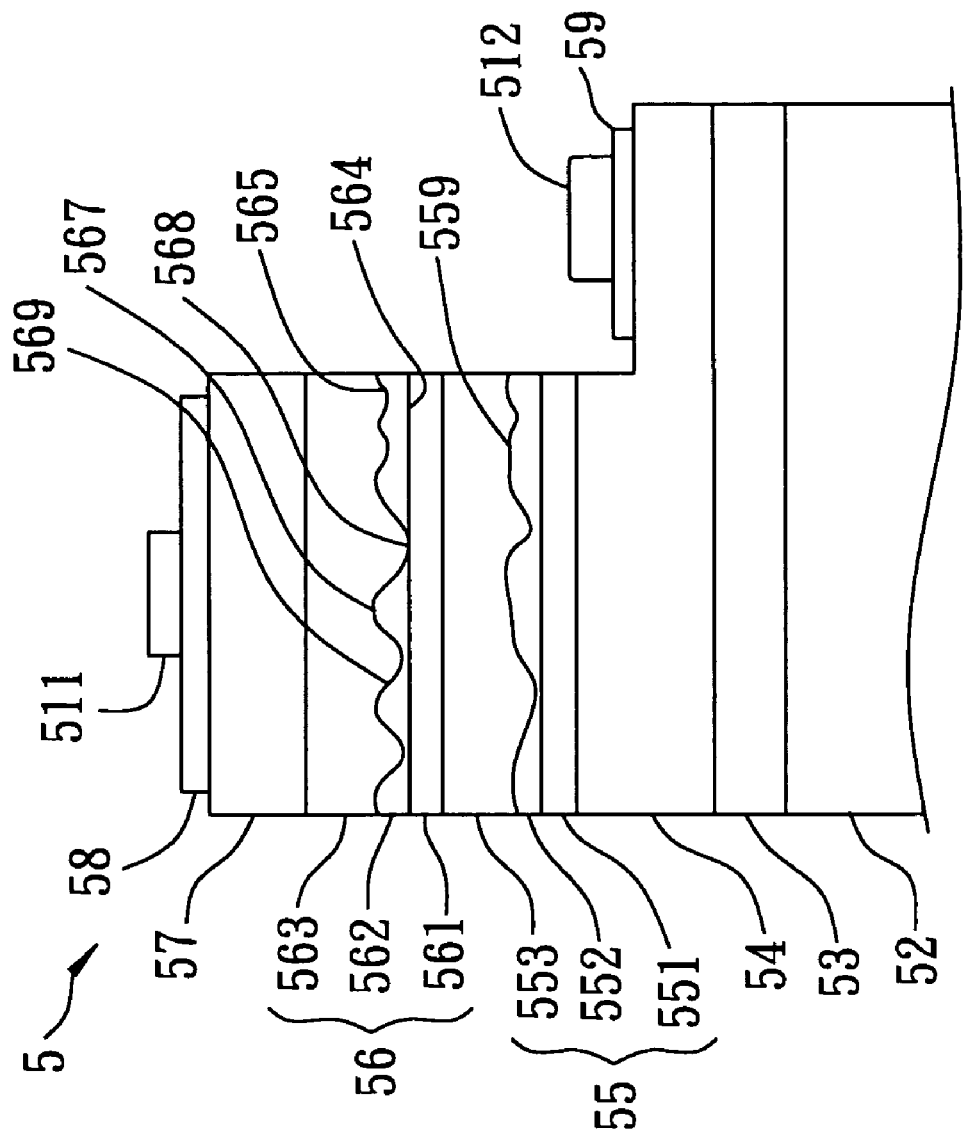
FIG. 2 is a schematic view of a die used in the first preferred embodiment.

Referring to FIG. 2, the second light-emitting die 5 includes a first light-emitting layer 55 emitting the second radiation, and a second light-emitting layer 56 emitting the third radiation. In addition to the first and second light-emitting layers 55,56, the second light-emitting die 5 includes a substrate 52, a buffering layer 53 formed on the substrate 52, an n-type cladding layer 54 formed on the buffering layer 53 and interposed between the buffering layer 53 and the first light-emitting layer 55, a p-type cladding layer 57 formed on the second light-emitting layer 56, a p-side contact layer 58 formed on the p-type cladding layer 57, a p-type electrode 511 formed on the p-side contact layer 58 and electrically connected to one of the leads 32, an n-side contact layer 59 formed on the n-type cladding layer 54, and an n-type electrode 512 formed on then-side contact layer 59 and electrically connected to the other one of the leads 32.

The second light-emitting layer 56 includes a first barrier film 563 proximate to the p-type cladding layer 57, a second barrier film 561 proximate to the first light-emitting layer 55, and a carrier confining film 562 between the first and second barrier films 563,561. The carrier confining film 562 has a bottom surface 564 proximate to the second barrier film 561 and a top surface 565 proximate to the first barrier film 563, and is configured with a mountain shape profile 569 having a plurality of alternating peaks 567 and valleys 568.

Figure 3:
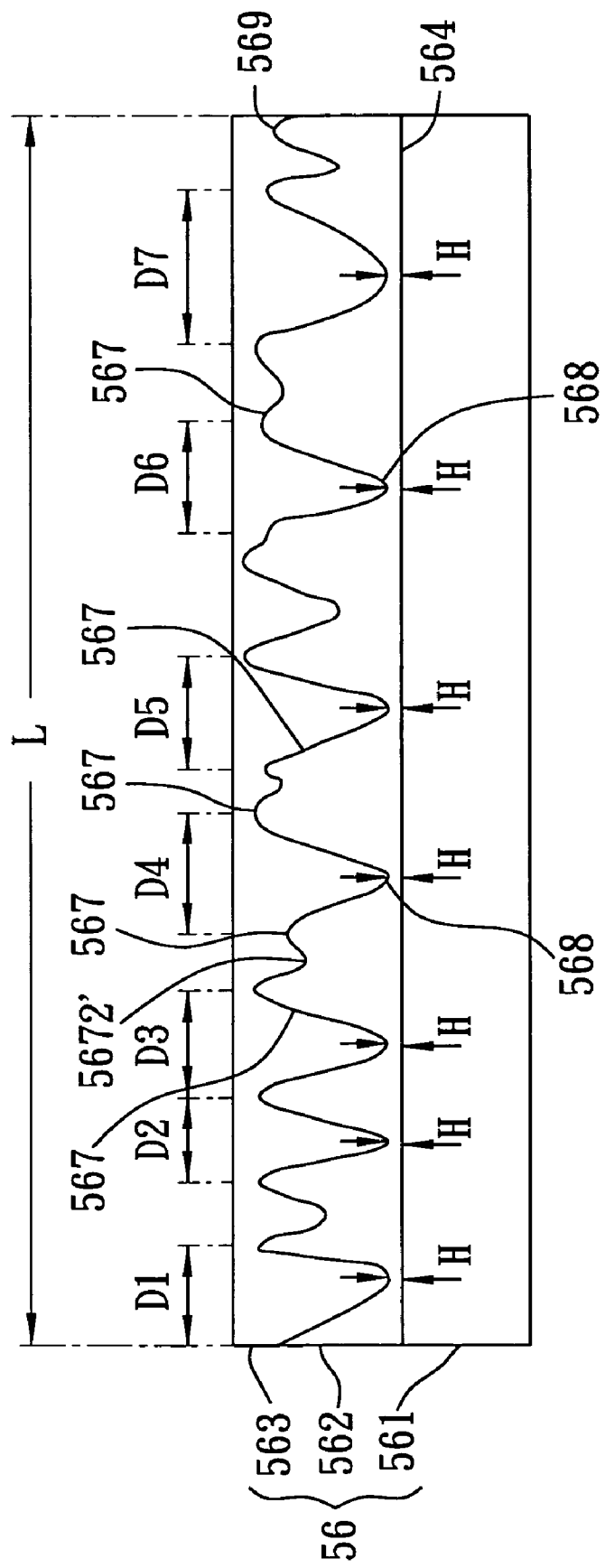
FIG. 3 is a schematic view of a light-emitting layer used in the first preferred embodiment.

Referring to FIG. 3, in the mountain shape profile 569, each of the valleys 568 has a height (H) relative to the bottom surface 564 of the carrier confining film 562, and the height (H) ranges from 0 to 2 mm. Therefore, the recess portion 5672' does not meet the definition of the valley 568. A valley density is defined by a ratio of a summation of the widths (D1,D2,D3,D4,D5,D6,D7 ...) of the valleys 568 to a total length (L) of the second light-emitting layer 56 along a direction that the widths (D1,D2,D3,D4,D5,D6,D7 ...) are measured. Preferably, the second light-emitting layer 56 has a valley density ranging from 5% to 75%.

The carrier confining film 562 has an energy gap which should be smaller than those of the first and second barrier films 563,561. In the preferred embodiment, the carrier confining film 562 is made of an indium-containing material having the formula $Al_{(1-x-y)}In_yGa_xN$, wherein $0 \leq x \leq 1$, $0 < y \leq 1$, and $0 \leq 1-x-y < 1$. The first and second barrier films 563,561 are made of gallium nitride in this embodiment.

The ratio of x and y can be adjusted so as to emit the third radiation, i.e., the blue light. In addition, the intensity of the third radiation can be adjusted by varying the valley density of the mountain shape profile 569. In the preferred embodiment, the valley density of the second light-emitting layer 56 is 38%.

Similarly, referring again to FIG. 2, the first light-emitting layer 55 includes a first barrier film 553 proximate to the second barrier film 561 of the second light-emitting layer 56, a second barrier film 551 proximate to the n-type cladding layer 54, and a carrier confining film 552 between the first and second barrier films 553,551. The carrier confining film 552 is configured with a mountain shape profile 559. The second radiation emitted by the first light-emitting layer 55 can be adjusted by varying the ratio of x and y in the formula of the material for the carrier confining film 552 so as to result in the second radiation, i.e., the green light. Moreover, the intensity of the second radiation can be adjusted by varying the valley density of the mountain shape profile 559 of the carrier confining film 552. In the preferred embodiment, the valley density of the first light-emitting layer 55 is 8%.

In addition to the fact that the intensities of the second and third radiations emitted respectively by the first and second light-emitting layers 55, 56 can be adjusted through the valley densities of the mountain shape profiles 559,569 of the first and second light-emitting layers 55,56, the intensities of the second and third radiations can be further adjusted and increased by using a plurality of the first and second light-emitting layers 55,56, respectively. Furthermore, the mountain shape profile 559 of the first light-emitting layer 55 can be replaced with a quantum well.

Moreover, in the preferred embodiment, the substrate 52 is made of a light-transmissive sapphire. The buffering layer 53 is a laminate composed of a low-temperature-grown gallium nitride film, a high-temperature-grown silicon nitride film, and a high-temperature-grown gallium nitride film (not shown). The n-type cladding layer 54 is an n-type indium gallium nitride semiconductor layer. The p-type cladding layer 57 is a p-type indium gallium nitride semiconductor layer. The p-side contact layer 58 is a transparent indium tin oxide layer. The n-side contact layer 59 is an ohmic contact layer made of chromium.

Figure 4:
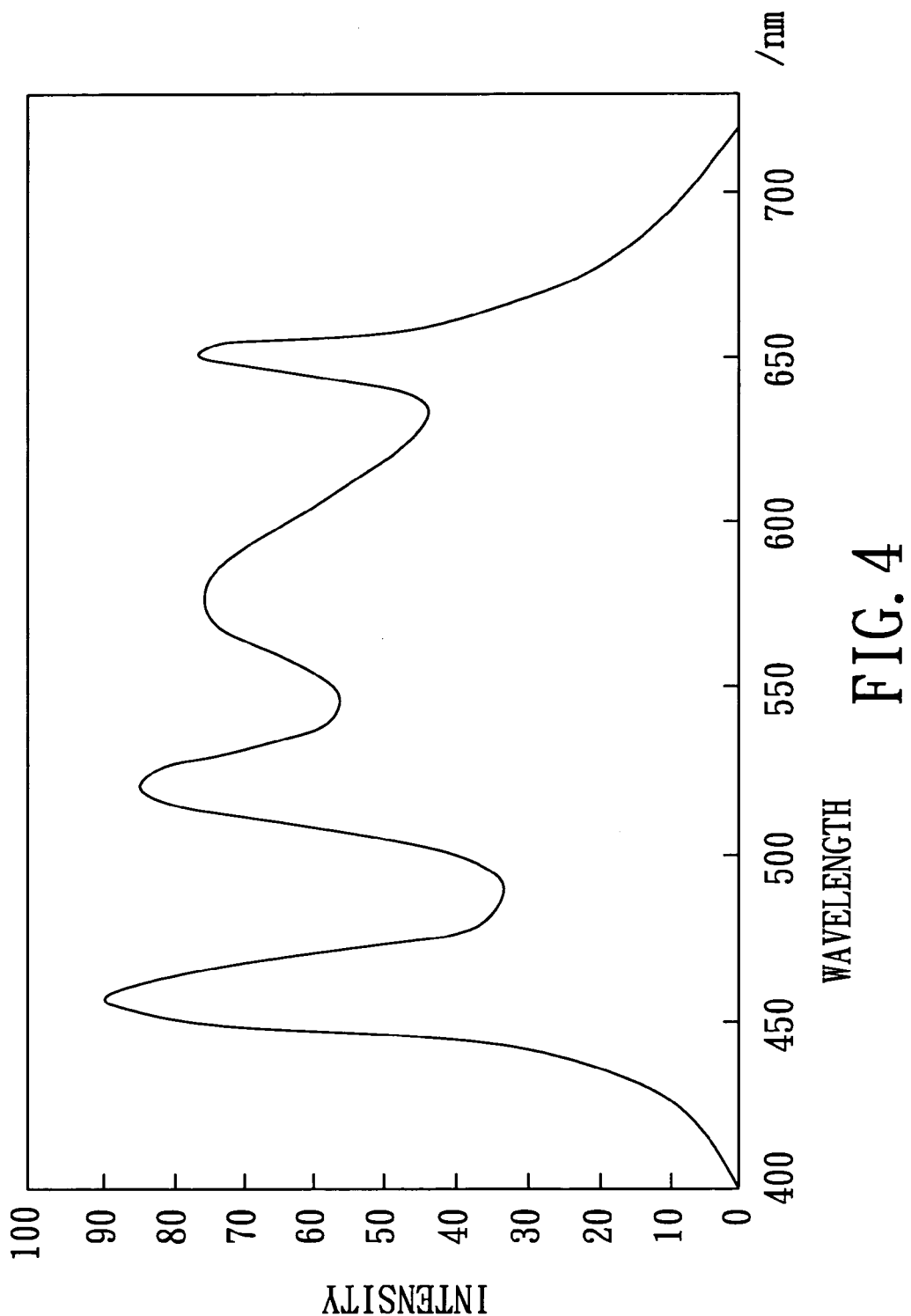
FIG. 4 illustrates spectrum characteristics of the first preferred embodiment.

Referring to FIG. 4, the first radiation emitted by the first light-emitting die 4 of the white-light emitting semiconductor device of the first preferred embodiment is the red light having a wavelength of about 650 nm. The second and third radiations emitted by the second light-emitting die 5 are the green light having a wavelength of about 530 nm and the blue light having a wavelength of about 460, respectively. The fourth radiation emitted by the photostimulable luminescent substance 6 is the yellow light having a wavelength of about 575 nm. The yellow light can be mixed with the red, green and blue lights to produce the white light. Since the photostimulable luminescent substance 6 can be excited by the third radiation (i.e., the blue light) to emit the yellow light, and since the first light-emitting die 4 can emit the red light, the color rendering index and other optical characteristics can be improved by this invention. Therefore, the disadvantages of the prior art that result from the insufficient yellow or red light can be overcome. Furthermore, since the second light-emitting die 5 can emit two radiations having different wavelengths at the same time, the white-light emitting semiconductor device of this invention has the effects of being energy-efficient and having a relatively reduced size.

Figure 5:
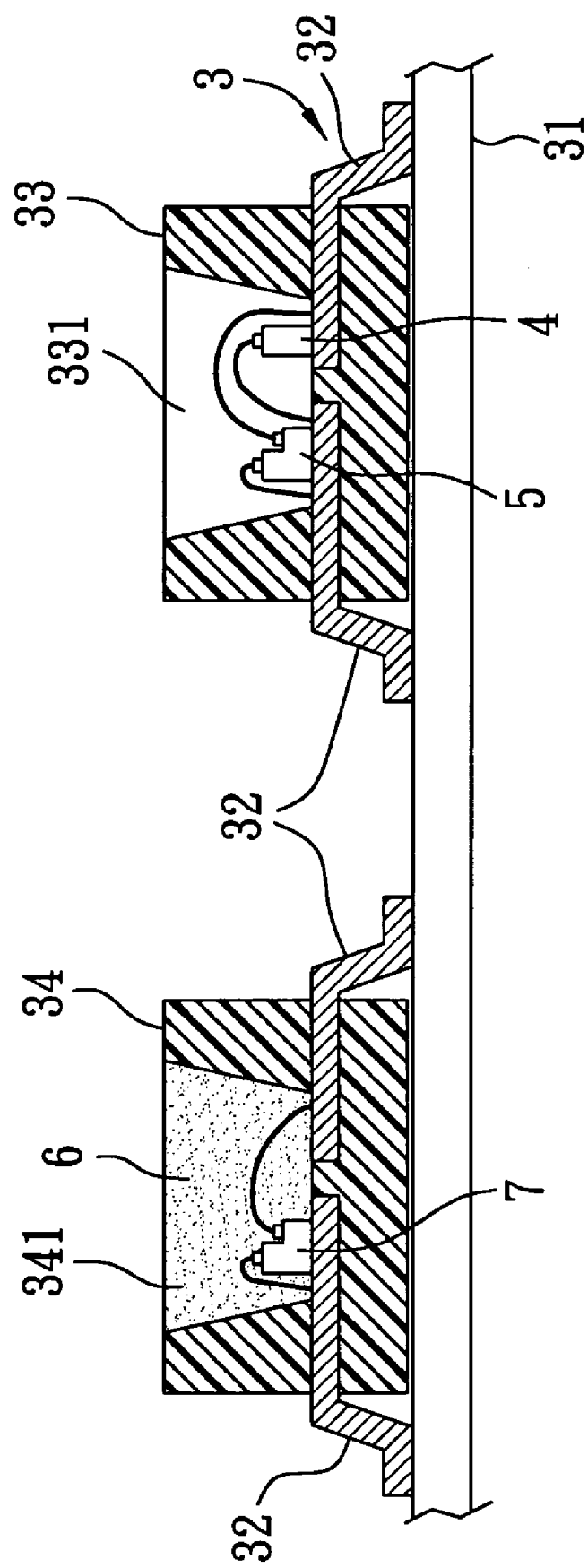
FIG. 5 is a schematic sectional view of the second preferred embodiment of a white-light emitting semiconductor device according to this invention.

Referring to FIG. 5, the second preferred embodiment of a white-light emitting semiconductor device according to this invention is shown to include the first light-emitting die 4 emitting the first radiation, the second light-emitting die 5 emitting the second and third radiations, a third light-emitting die 7 emitting a fifth radiation, the photostimulable luminescent substance 6, and the holding assembly 3. The photostimulable luminescent substance 6 is excitable by the fifth radiation of the third light-emitting die 7 to emit the fourth radiation.

The holding assembly 3 includes the conductive supporting body 31, the first and second holding members 33, 34 mounted on the conductive supporting body 31, and first and second pairs of leads 32 electrically connected to the conductive supporting body 31. The first holding member 33 is formed with a receiving recess 231 for receiving the first and second light-emitting dies 4, 5. The second holding member 34 is formed with a receiving recess 341 for receiving the third light-emitting die 7. Each of the first pair of the leads 32 is electrically connected to the first and second light-emitting dies 4,5. Each of the second pair of the leads 32 is electrically connected to the third light-emitting die 7. The photostimulable luminescent substance 6 is filled in the receiving recess 341 of the second holding member 34 to encapsulate the third light-emitting die 7.

In this preferred embodiment, the conductive supporting body 31 is a printed circuit board. The first radiation emitted by the first light-emitting die 4 is the red light. The second and third radiations emitted by the second light-emitting die 5 are the green and blue lights, respectively. The fifth radiation emitted by the third light-emitting die 7 is the blue light. The fourth radiation emitted by the photostimulable luminescent substance 6 is the yellow light, which is mixed with the red, green and blue lights to emit the white light.

When the holding assembly 3 is electrically connected to an external electric source (not shown), the first light-emitting die 4 is actuated to emit the first radiation, the second light-emitting die 5 is actuated to emit the second and third radiations, and the third light-emitting die 7 is actuated to emit the fifth radiation, which excites the photostimulable luminescent substance 6 to emit the fourth radiation. The fourth radiation is mixed with the first, second, third, and fifth radiations to result in the white light.

It should be noted that according to the specific requirement of the target environment, the white light having the desired color temperature can be obtained by adjusting the wavelength of the first, second, third, or fifth radiations, or by changing the number of the first, second or third light-emitting die 4,5,7. For example, the third radiation of the second light-emitting die 5 can be adjusted to emit a cyanish blue light, which is mixed with the red light emitted by the first light-emitting die 4, the green light emitted by the second light-emitting die 5, the blue light emitted by the third light-emitting die 7, and the yellow light emitted by the photostimulable luminescent substance 6 to produce a white light having a high CRI.

Figure 6:
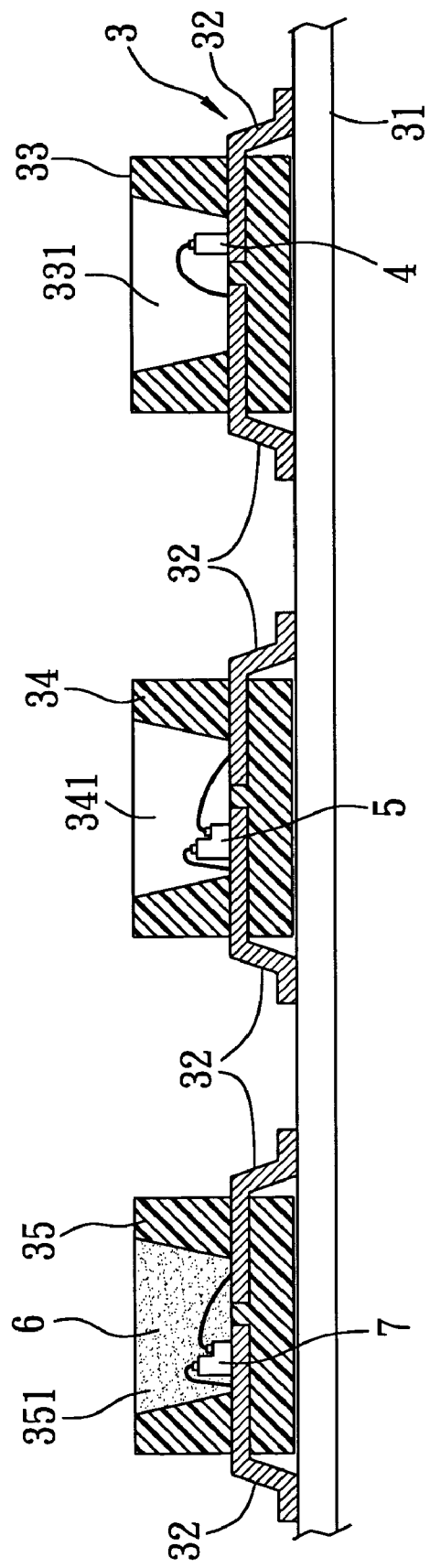
FIG. 6 is a schematic sectional view of the third preferred embodiment of a white-light emitting semiconductor device according to this invention.

Referring to FIG. 6, the third preferred embodiment of a white-light emitting semiconductor device according to this invention is shown to be similar to the second preferred embodiment, except for the following: The holding assembly 3 includes a conductive supporting body 31, first, second and third holding members 33,34,35 mounted on the conductive supporting body 31, and first, second and third pairs of leads 32 electrically connected to the conductive supporting body 31. The first holding member 33 is formed with a receiving recess 331 for receiving the first light-emitting die 4. The second holding member 34 is formed with a receiving recess 341 for receiving the second light-emitting die 5. The third light-emitting die 35 is held on the third holding member 35, which is formed with a receiving recess 351 for receiving the third light-emitting die 7. Each of the first pair of the leads 32 is electrically connected to the first light-emitting die 4. Each of the second pair of the leads 32 is electrically connected to the second light-emitting die 5. Each of the third pair of the leads 32 is electrically connected to the third light-emitting die 7. The photostimulable luminescent substance 6 is filled in the receiving recess 351 of the third holding member 35 to encapsulate the third light-emitting die 7.

Figure 7:
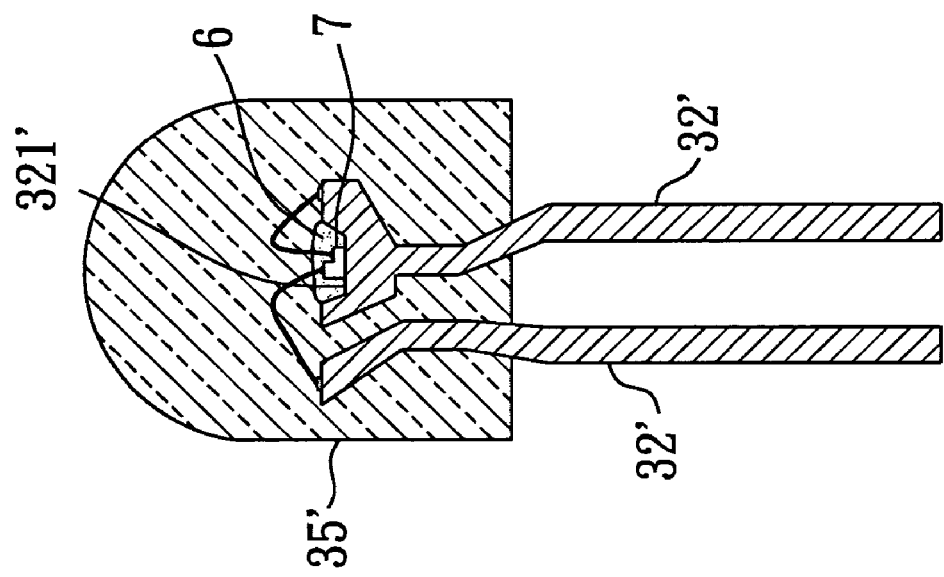
FIG. 7 is a schematic sectional view of the fourth preferred embodiment of a white-light emitting semiconductor device according to this invention.

Referring to FIG. 7, the fourth preferred embodiment of a white-light emitting semiconductor device according to this invention is shown to be similar to the third preferred embodiment, except for the following: One of the third pair of the leads 32' is formed with a receiving recess 321' for receiving the third light-emitting die 7. The photostimulable luminescent substance 6 is filled in the receiving recess 321' of the one of the third pair of the leads 32' to encapsulate the third light-emitting die 7. The third holding member 35' is made of a light-transmissive encapsulating material (such as resin) and encapsulates the third light-emitting die 7 and the photostimulable luminescent substance 6.

Figure 8:
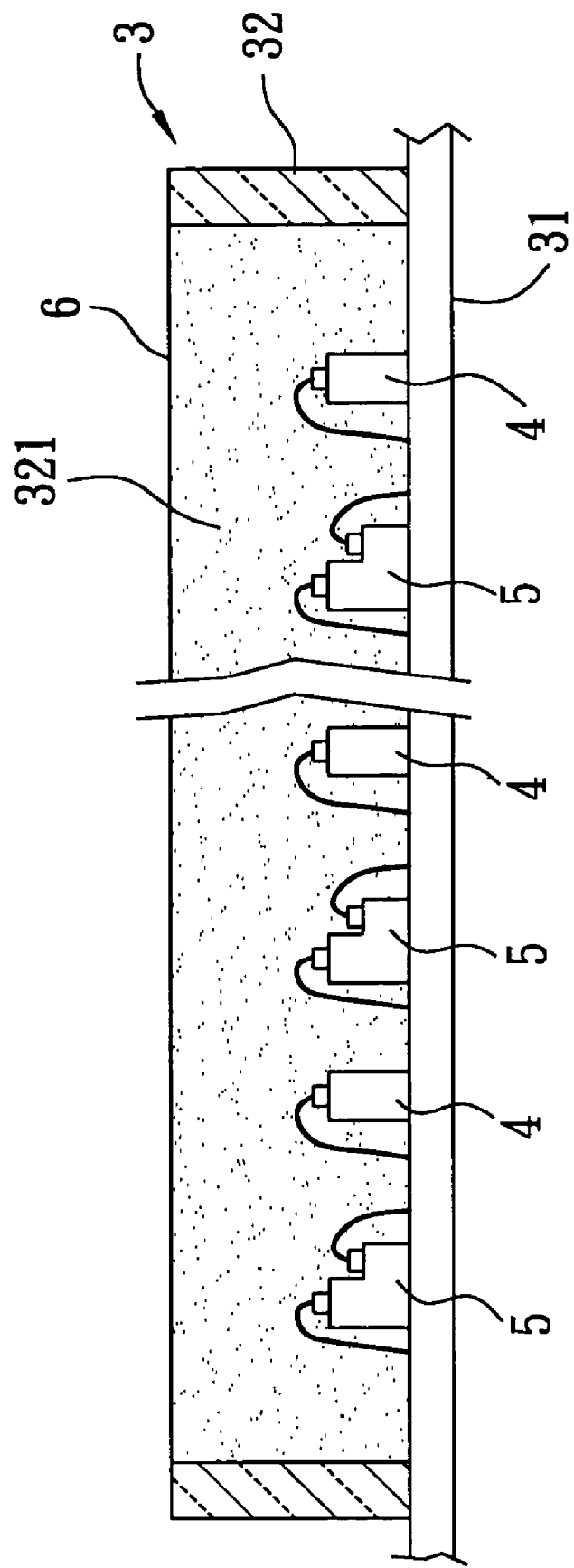
FIG. 8 is a schematic sectional view of the fifth preferred embodiment of a white-light emitting semiconductor device according to this invention.

Referring to FIG. 8, the fifth preferred embodiment of a white-light emitting semiconductor device according to this invention is shown to be similar to the first preferred embodiment, except for the following: In the fifth preferred embodiment, the white-light emitting semiconductor device includes the holding assembly 3, a plurality of the first light-emitting dies 4, a plurality of the second light-emitting dies 5, and the photostimulable luminescent substance 6. The holding assembly 3 includes the conductive supporting body 31 and a peripheral wall 32 extending upward from the conductive supporting body 31 so as to define a receiving space 321. The peripheral wall 32 is made of light-transmissive resin. The first and second light-emitting dies 4, 5 are mounted alternately on the conductive supporting body 31 within the receiving space 321. The photostimulable luminescent substance 6 is filled in the receiving space 321 to encapsulate the first and second light-emitting dies 4,5. Additionally, at least one of a further light-emitting die (not shown), which emits a fifth radiation exciting the photostimulable luminescent substance 6, can be mounted on the conductive supporting body 31 within the receiving space 321 so as to enhance the brightness of the fourth radiation.

Figure 9:
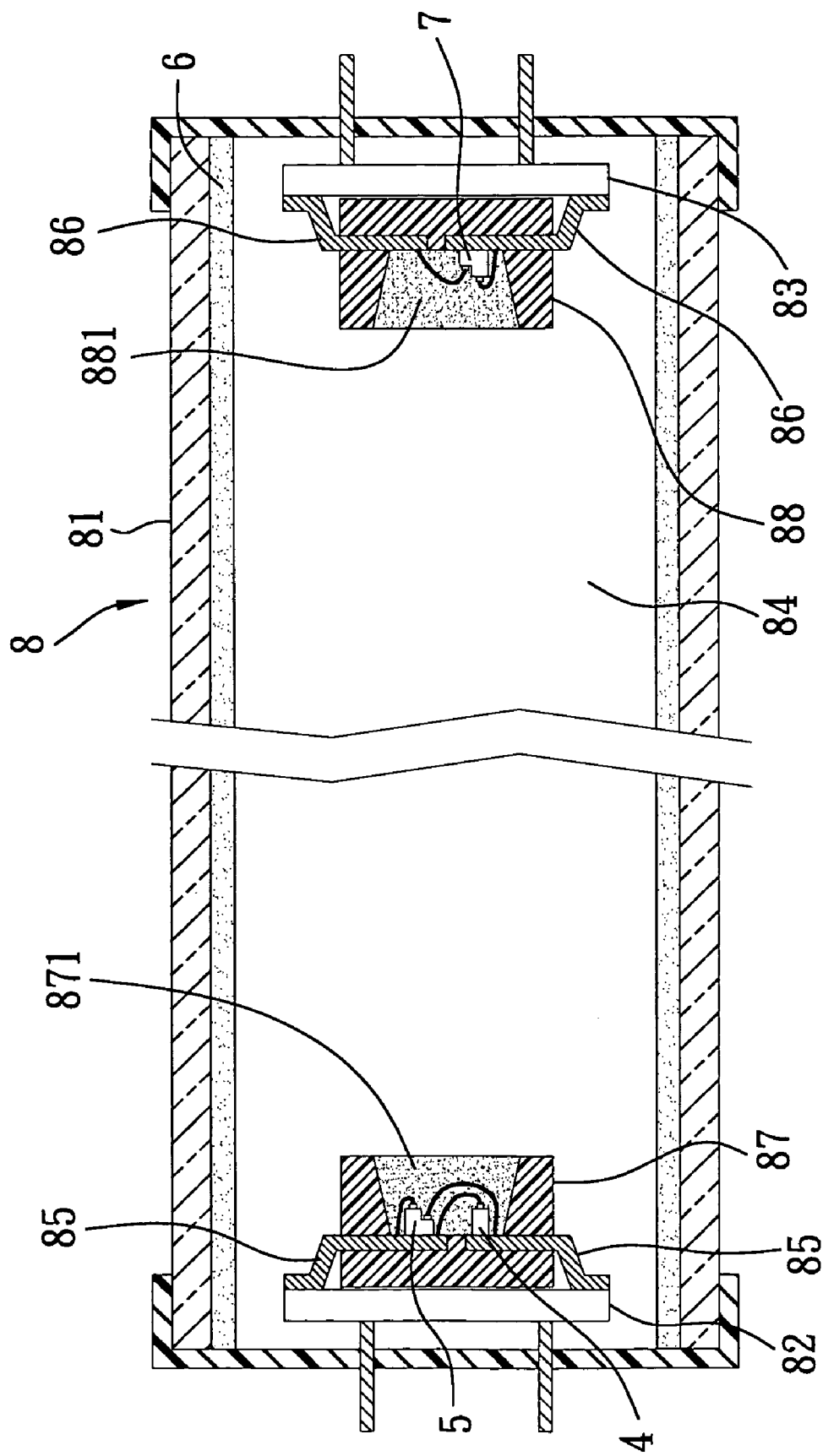
FIG. 9 is a schematic sectional view of the sixth preferred embodiment of a white-light emitting semiconductor device according to this invention.

Referring to FIG. 9, the sixth preferred embodiment of a white-light emitting semiconductor device according to this invention is shown to include the first light-emitting die 4 emitting the first radiation, the second light-emitting die 5 emitting the second and third radiations, the third light-emitting die 7 emitting the fifth radiation, the photostimulable luminescent substance 6, and the holding assembly 8. The holding assembly 8 includes a transparent shell body 81 defining a receiving space 84, first and second conductive supporting bodies 82,83 attached oppositely to the shell body 81, and first and second holding members 87, 88 mounted on the first and second conductive supporting bodies 82, 83, respectively, within the receiving space 84. The first holding member 87 is formed with a receiving recess 871 for receiving the first and second light-emitting dies 4, 5. The second holding member 88 is formed with a receiving recess 881 for receiving the third light-emitting die 7. A first pair of leads 85 is electrically connected to the first conductive supporting body 82, and each of the leads 85 is electrically connected to the first and second light-emitting dies 4,5. A second pair of leads 86 is electrically connected to the second conductive supporting body 83, and each of the leads 86 is electrically connected to the third light-emitting die 7. The photostimulable luminescent substance 6 is coated on the shell body 81. The photostimulable luminescent substance 6 is excitable by the fifth radiation of the third light-emitting die 7 and/or by the third radiation of the second light-emitting die 5. Optionally, the photostimulable luminescent substance 6 can be filled into the receiving recess 871 of the first holding member 87 and the receiving recess 881 of the second holding member 88. In this preferred embodiment, the first radiation emitted by the first light-emitting die 4 is the red light. The second and third radiations emitted by the second light-emitting die 5 are the green light and the blue light, respectively. The fifth radiation emitted by the third light-emitting die 7 is the blue light, or a UV light. The fourth radiation emitted by the photostimulable luminescent substance 6 is the yellow light. When the fifth radiation is the UV light, the wavelength range thereof is smaller than 495 nm.

While the present invention has been described in connection with what is considered the most practical and preferred embodiments, it is understood that this invention is not limited to the disclosed embodiments but is intended to cover various arrangements included within the spirit and scope of the broadest interpretation so as to encompass all such modifications and equivalent arrangements.

I claim:

1. A white-light emitting semiconductor device, comprising:
   a first light-emitting die emitting a first radiation having a first wavelength range;
   a second light-emitting die emitting a second radiation having a second wavelength range, and a third radiation having a third wavelength range shorter than the second wavelength range;
   a photostimulable luminescent substance excitable to emit a fourth radiation having a fourth wavelength range, the fourth radiation being mixed with the first, second, and third radiations to result in white light;
   and a holding assembly holding said first and second light-emitting dies, and said photostimulable luminescent substance, wherein said second light-emitting die includes a first light-emitting layer emitting the second radiation, a second light-emitting layer emitting the third radiation, a p-type cladding layer, and an n-type cladding layer, said first and second light-emitting layers being disposed between said p-type and n-type cladding layers, said second light-emitting layer being proximate to said p-type cladding layer, and including a first barrier film proximate to said p-type cladding layer, a second barrier film, and a carrier confining film between said first and second barrier films and having a plurality of alternating peaks and valleys, said carrier confining film having an energy gap smaller than those of said first and second barrier films, wherein said second light-emitting layer has a valley density ranging from 5% to 75%, the valley density being defined by a ratio of a summation of the widths of said valleys to a total length of said second light-emitting layer along a direction that the widths are measured.

2. The white-light emitting semiconductor device as claimed in claim 1, wherein said carrier confining film is made of a material having a formula $Al_{(1-x-y)}In_yGa_xN$, wherein $0 \leq x < 1$, $0 < y \leq 1$, and $0 \leq 1-x-y < 1$.

3. The white-light emitting semiconductor device as claimed in claim 1, wherein said photostimulable luminescent substance is excitable by the third radiation of said second light-emitting die.

4. The white-light emitting semiconductor device as claimed in claim 1, further comprising a third light-emitting die emitting a fifth radiation, said photostimulable luminescent substance being excitable by the fifth radiation of said third light-emitting die.

5. The white-light emitting semiconductor device as claimed in claim 1, wherein the first wavelength range is from 575 nm to 700 nm, the second wavelength range being from 495 nm to 560 nm, the third wavelength range being from 400 nm to 495 nm.

6. The white-light emitting semiconductor device as claimed in claim 1, wherein the fourth wavelength range is from 540 nm to 600 nm.

7. The white-light emitting semiconductor device as claimed in claim 4, wherein the fifth radiation has a fifth wavelength range smaller than 495 nm.

8. The white-light emitting semiconductor device as claimed in claim 1, wherein said photostimulable luminescent substance includes a material having a formula $R_3(Al_{(1-x)},Ga_x)_5O_{12}:Ce$, where R is selected from the group consisting of Y, Tb, Gd, Lu, La, Sm, and $0 \leq x \leq 1$.

9. The white-light emitting semiconductor device as claimed in claim 8, wherein said photostimulable luminescent substance is selected from the group consisting of YAG:Ce and TbAG:Ce.

* * * * *